(12) United States Patent
Lee

(10) Patent No.: US 6,658,313 B1
(45) Date of Patent: Dec. 2, 2003

(54) APPARATUS FOR ADJUSTING THE ORIGINS OF MODULE HEADS OF A SURFACE MOUNTING APPARATUS AND METHOD THEREFOR

(75) Inventor: Chang Hyun Lee, Kyungki-do (KR)

(73) Assignee: Mirae Corporation, Choongchungnam-do (KR)

( * ) Notice: Subject to any disclaimer, the term of this patent is extended or adjusted under 35 U.S.C. 154(b) by 0 days.

(21) Appl. No.: 09/576,863

(22) Filed: May 22, 2000

(30) Foreign Application Priority Data

May 27, 1999 (KR) ......................................... 1999-19302
Dec. 28, 1999 (KR) ......................................... 1999-64104

(51) Int. Cl.$^7$ .............................................. G06F 19/00
(52) U.S. Cl. ........................... 700/117; 700/57; 700/64; 700/255; 702/95; 29/742; 29/832
(58) Field of Search ......................... 700/56–59, 61–64, 700/114, 121, 255, 259, 117; 702/87, 94, 95; 29/832, 833, 834, 742

(56) References Cited

U.S. PATENT DOCUMENTS

| | | | |
|---|---|---|---|
| 5,105,368 A | * | 4/1992 | Alexandersen et al. ...... 700/254 |
| 5,247,608 A | * | 9/1993 | Flemming et al. ........... 700/255 |
| 5,778,525 A | * | 7/1998 | Hata et al. .................... 29/836 |
| 5,855,059 A | * | 1/1999 | Togami et al. ................. 29/740 |
| 6,007,631 A | * | 12/1999 | Prentice et al. .............. 118/669 |
| 6,216,341 B1 | * | 4/2001 | Nakahara ....................... 29/833 |
| 6,236,896 B1 | * | 5/2001 | Watanabe et al. ............... 700/37 |
| 6,347,442 B1 | * | 2/2002 | Hwang ........................ 29/281.4 |

* cited by examiner

Primary Examiner—Leo Picard
Assistant Examiner—Paul Rodriguez
(74) Attorney, Agent, or Firm—Rosenberg, Klein & Lee

(57) ABSTRACT

There is disclosed an apparatus for adjusting the origins of module heads of a surface mounting apparatus for a dual gantry, the adjusting apparatus, and method therefor. The invention includes the X-Y gantry consisting of first and second X-axis linear motors and first and second Y-axis linear motors, and having X-Y plane on which first and second reference points and a mark indicating the origin (MIO) are set, first and second module heads installed at the first a nd second X-axis linear motors, first and second vision units installed in vicinity of the first and second module heads, respectively, and for sensing the first and second reference points and the MIO and generating and outputting coordinates of the sensed first and second reference points and the MIO, and a controller for driving the first and second X-axis linear motors and the first and second Y-axis linear motors to move the first and second vision units to the first and second reference points and the MIO, receiving the coordinates output from the first and second vision units to compute offset values relating to the first and second module heads, and, if there are the offset values, setting the origins of the first and second module heads by correcting the offset values. Thus, the repeated precision of the adjustment of the origins can be improved, also, the apparatus for adjusting the origins of the first and second module heads are easily incorporated into the surface mounting apparatus for the dual gantry.

8 Claims, 4 Drawing Sheets

APPARATUS FOR ADJUSTING THE ORIGINS OF MODULE HEADS OF A SURFACE MOUNTING APPARATUS AND METHOD THEREFOR

BACKGROUND OF THE INVENTION

1. Field of the Invention

The present invention relates to an apparatus for adjusting the origins of module heads of a surface mounting apparatus and method therefor, and more particularly to an apparatus for adjusting the origins of module heads of a surface mounting apparatus to which a dual gantry is applied and method therefor.

2. Description of the Conventional Art

A surface mounting apparatus SMA is used to perform the precise and high speed mounting of electronic components suitable for surface mounting the electronic components on a printed circuit board PCB. To this end, the SMA generally comprises an X-Y gantry, a module head, a vision unit and a transfer unit.

To move a module head in X-Y axes directions, the X-Y gantry is provided with a vision unit which is installed in vicinity of the module head. The vision unit is used to sense whether or not the electronic component taken by the module head are in accurate position and posture. Simultaneously with the taking of the electronic component by the module head, the PCB to be used for mounting the component is supplied by the transfer unit. When the PCB is transferred to a work site by the transfer unit, the module head performs the mounting of the electronic component.

The structure of the SMA for mounting the surface-mounting electronic components onto the PCB will be in detail described with reference to the drawing.

FIG. 1 is a front view of a conventional surface mounting apparatus. As shown in FIG. 1, the X-Y gantry 2 is provided on a top surface of a base frame 1. A module head 3 is assembled into the X-Y gantry 2, and the transfer unit 5 for supplying the PCB is installed between the base frame 1 and the module head 3. When the PCB is transferred to the work site by the transfer unit 5, the module head 3 takes the surface-mounting electronic component, is moved on the plane in X- and Y-axes directions to surface mount the component.

For a high speed mounting of the component onto the PCB, the module head 3 consists of a plurality of heads 3a, 3b, 3c. The heads 3a, 3b, 3c are arranged with a predetermined interval. Each head takes and mounts the component, whereby high speed mounting of the components is accomplished. High speed mounting of the components can be achieved by the module head 3 having a plurality of heads 3a, 3b, 3c, and the mounting precision is increased through the use of the vision unit 4 used for sensing the position and posture of the component mounted onto the PCB.

The vision unit 4 has a camera 4a for sensing the position and posture of the component taken by the module head 3 and analyses information on the position and posture sensed by the camera 4a. By such a analysis, the module head 3 can accurately mount the component on the PCB, and therefore the mounting precision is maintained.

The module head for mounting the component onto the PCB may need an adjustment of the origin thereof, which is necessary for performing the sensing of an accurate position to be mounted and the precise and high speed moving of the module head. A conventional method for adjusting the origin of the module head is conducted by a manual adjustment in which the operator manually moves the module head to the origin position marked on a bottom surface of the X-Y gantry in order to adjust the origin. In the case of such a manual operation, there occurs a problem in that the origin adjustment precision is reduced and unwanted accident may occur.

To improve the method for adjusting the origin based upon such a manual operation, a laser, reflection mirror, and an interferometer may be employed. The interferometer and the laser are installed in the module head, whereas the reflection mirror is installed in the fixed base frame. In operation, the laser radiates the laser light which is incident upon the reflection mirror which reflects the incident light. The phase difference of the reflected light is sensed by the interferometer, and used to obtain the distance between the currently fixed reflection mirror and the module head and then to measure the origin of the module head.

The measurement of the origin by using the interferometer requires a number of parts, i.e., the laser, the interferometer, and the reflection mirror. In the case of assembling such a plurality of parts into the SMA, there arises a problem in that the assembling procedures are complicated and the installation cost increases, etc.

SUMMARY OF THE INVENTION

Therefore, it is an object of the present invention to provide an apparatus for adjusting the origins of first and second module heads of a surface mounting apparatus to which an X-Y gantry is applied, by using first and second reference points, a mark indicating the origin, and vision units, and method therefor.

Another object of the present invention is to provide an apparatus capable of simultaneously adjusting the origins of the first and second module heads installed in the dual gantry, and method therefor.

Further another object of the present invention is to provide an improved precision of the origin adjustment in which the first and second reference points, the MIO and the vision units are used to adjust the origins of a plurality of the module heads, and the prompt adjustment by simultaneous adjustment of the origins.

Further another object of the present invention is to provide an easy incorporation of the origin adjustment apparatus into the surface mounting apparatus in that the first and second reference points, the MIO, and the vision units are used to adjust the origins of the first and second module heads.

According to one aspect of the present invention, there is provided an apparatus for adjusting the origins of module heads of a surface mounting apparatus for a dual gantry, the adjusting apparatus comprising: the X-Y gantry consisting of first and second X-axis linear motors and first and second Y-axis linear motors, and having X-Y plane on which first and second reference points and a mark indicating the origin (MIO) are set; first and second module heads installed at the first and second X-axis linear motors; first and second vision units installed in vicinity of the first and second module heads, respectively, and for sensing the first and second reference points and the MIO and generating and outputting coordinates of the sensed first and second reference points and the MIO; and a controller for driving the first and second X-axis linear motors and the first and second Y-axis linear motors to move the first and second vision units to the first and second reference points and the MIO, receiving the coordinates output from the first and second vision units to compute offset values relating to the first and second module heads, and, if there are the offset values, setting the origins of the first and second module heads by correcting the offset values.

According to another aspect to the present invention, there is also provided a method for adjusting the origins of module heads of a surface mounting apparatus for a dual gantry, the method comprising the steps of: moving first and second vision units to first and second reference points, respectively; after completing the movement, moving the first and second units to the MIOs and sensing the respective MIOs; while the first and second vision units sense the MIOs, checking whether or not a secure distance between the first and second vision units is ensured; with the secure distance between the first and second vision units being ensured, in case the sensing of the MIOs is completed, computing coordinates of the origins of the respective first and second module heads based on the distance traveled from the MIOs as a base point to the first and second reference points; after each of the coordinates of the origins of the first and second module heads is computed, computing offset values due to the differences of the distances traveled by the first and second module heads; and setting the origins of the first and second module heads by correcting the obtained offset values.

DETAILED DESCRIPTION OF THE INVENTION

The present invention will be described in detail, with reference to the accompanying drawings.

Figure 1:
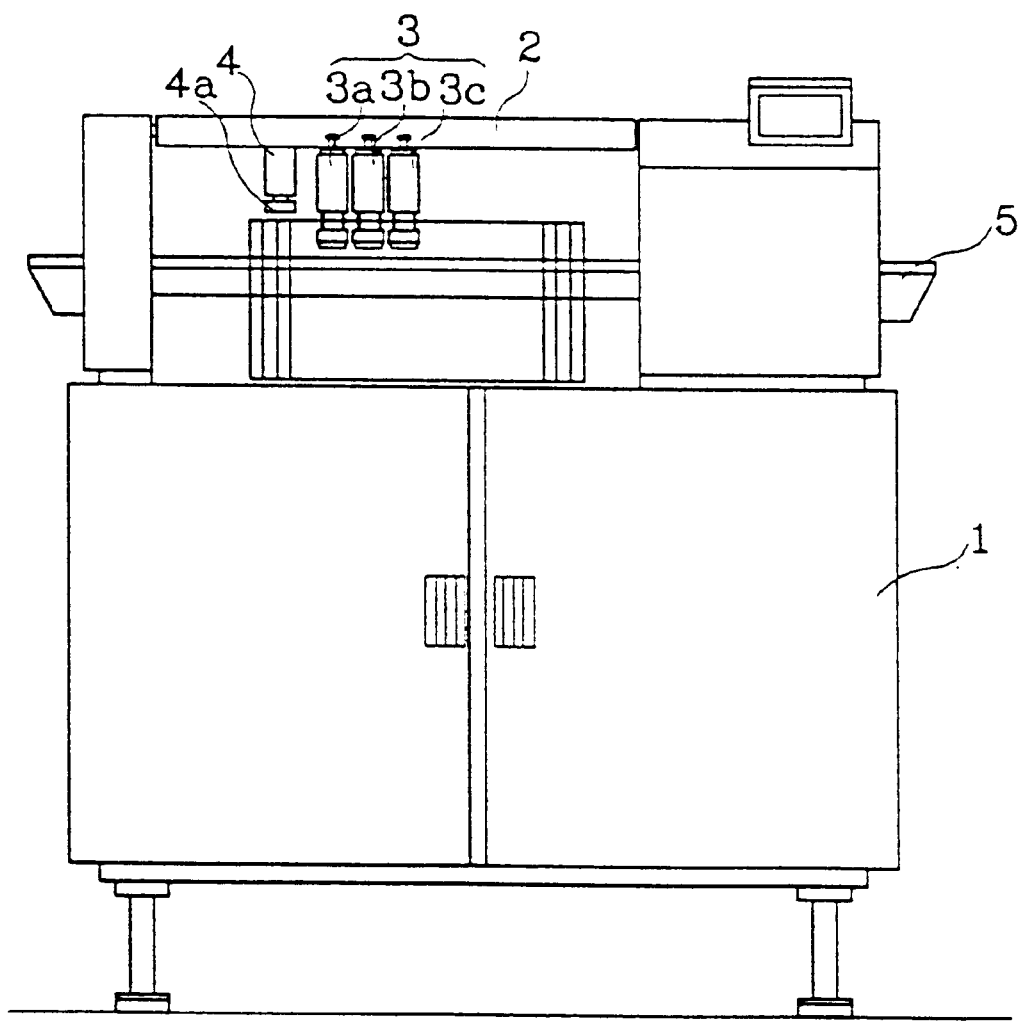
FIG. 1 is a front view of a conventional surface mounting apparatus.
Figure 2:
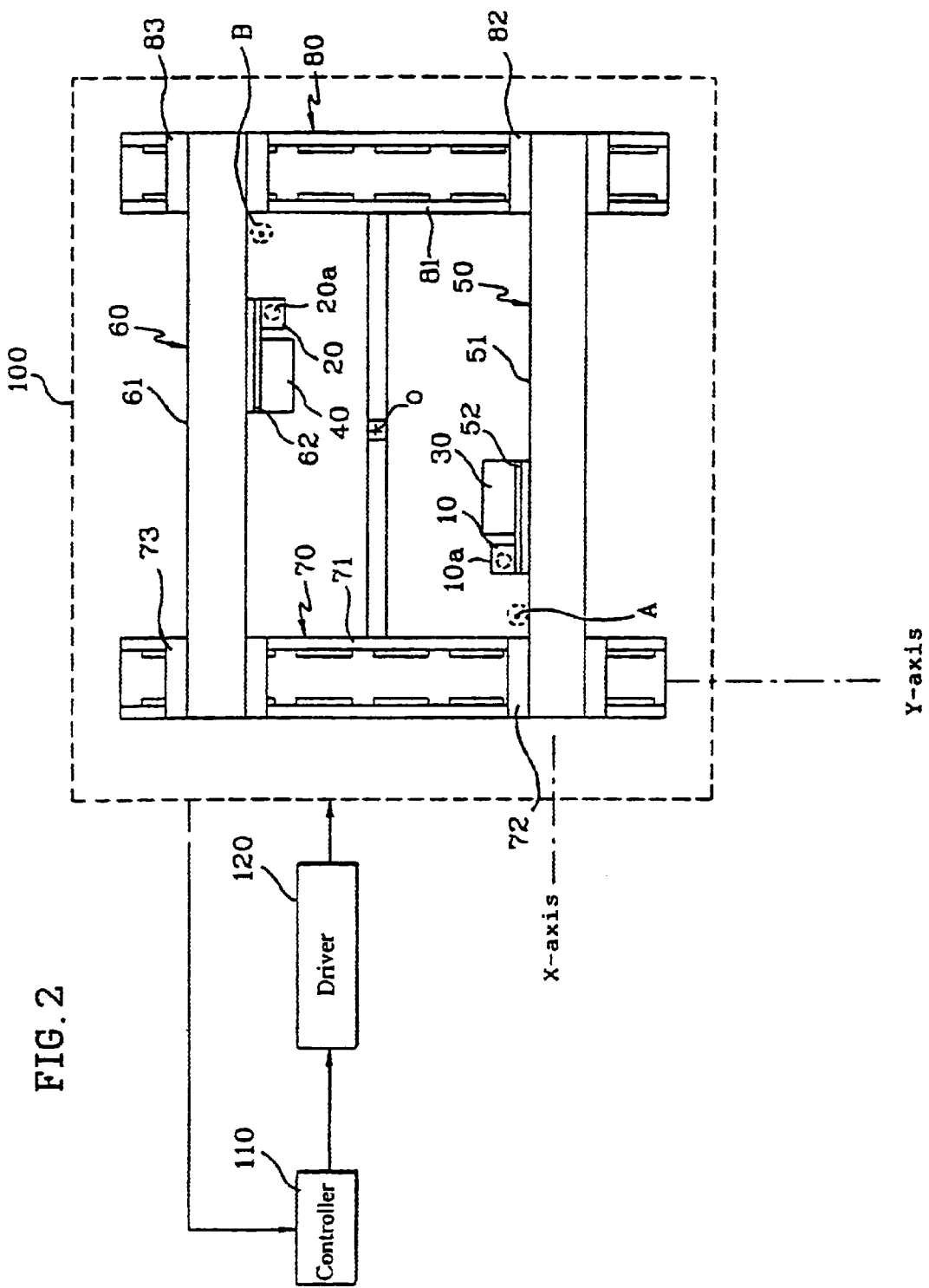
FIG. 2 is a front view of a dual X-Y gantry having an apparatus for adjusting the origins of module heads of a surface mounting apparatus.

FIG. 2 is a front view of a dual X-Y gantry having an apparatus for adjusting the origins of module heads of a surface mounting apparatus. As shown in FIG. 2, the apparatus comprises: an X-Y gantry 100 including first and second X-axis linear motors 50, 60 and first and second Y-axis linear motors 70, 80, and having an X-Y plane on which first and second reference points A, B and a mark indicating the origin (MIO) O are set; first and second module heads 30, 40 installed at the first and second X-axis linear motors 50, 60; first and second vision units 10, 20 installed in the vicinity of the first and second module heads 30, 40, respectively, for sensing the first and second reference points A, B and the MIO O, and generating and outputting coordinates of the sensed first and second reference points A, B and the MIO O; and, a controller 110 for driving the first and second X-axis linear motors 50, 60 and the first and second Y-axis linear motors 70, 80 to move the first and second vision units 10, 20 to the first and second reference points A, B and the MIO O, receiving the coordinates output from the first and second vision units 10, 20 to compute offset values relating to the first and second module heads 30, 40, and, if there are non-zero offset values, setting the origins of the first and second module heads 30, 40 by correcting the offset values.

A dual X-Y gantry 100 for a surface mounting apparatus to which the present invention is applied is provided with first and second X-axis linear motors 50, 60 in an X-axis direction. These first and second X-axis linear motors 50, 60, disposed parallel to each other in the X-axis direction, are arranged with a predetermined distance therebetween. Two parallel first and second X-axis linear motors 50, 60 have respective stator elements 51, 61 and movable elements 52, 62.

Each of the first and second vision units 10, 20 and each of the first and second module heads 30, 40 are fixedly installed on a surface of the respective movable elements 52, 62. Namely, the first vision unit 10 and module head 30 are fixed to the movable element 52 of the first X-axis linear motor 50, whereas the second vision unit 20 and module head 40 are fixed to the movable element 62 of the second X-axis linear motor 60. On each of bottom surfaces of the first and second X-axis linear motors 50, 60 is arranged each of the first and second Y-axis linear motors 70, 80, which are disposed parallel to each other and arranged with a predetermined distance therebetween.

The first and second Y-axis linear motors 70, 80 have respective stator elements 71, 81 having a plurality of movable elements 72, 73 and 82, 83, respectively. The first linear X-axis motor 50 is arranged on surfaces of the movable elements 72, 82 which are installed at the first and second Y-axis linear motors 70, 80, respectively, whereas the second X-axis linear motor 60 is installed at the movable elements 73, 83. The first and second X-axis motors 50, 60 installed at the movable elements 72, 73, 82, 83 of the Y-axis first and second linear motors 70, 80 are moved in the Y-axis direction according to the movement of the movable elements 72, 73, 82, 83.

As described above, the X-Y gantry 100 consists of the first and second X-axis linear motors 50, 60 and the first and second Y-axis linear motors 70, 80. Alternatively, each of the X-axis and Y-axis first and second motors 50, 60 and 70, 80 may be implemented by a motor (not shown) for generating the revolutional force for driving a frame (not shown).

As an example, the X-Y gantry 100 employing the linear motor will be described below. The X-Y gantry 100 using the first and second X-axis linear motors 50, 60 and the first and second Y-axis motors 70, 80 has a plane where first and second reference points A, B and a mark indicating the origin (hereinafter, referred to as "MIO") O are set. The first and second reference points A, B and the MIO are set in size such that the first and second vision units 10, 20 recognize those sizes at one time, and are formed in the plane of the X-Y gantry 100. This allows first and second cameras 10a, 20a included, respectively, in the first and second vision units 10, 20 to recognize each of the first and second reference points A, B and the MIO, through only one scanning operation.

The first and second vision units 10, 20 provide respective coordinates when respective first and second reference points A, B and the MIO are centrally aligned. A controller 110 receives the respective coordinates generated from the first and second vision units 10, 20. The controller 110 performs a general control for the X-Y gantry 100 through a movable element driver 120. For such a control, the X-Y gantry 100 sends various control signals to the driver 120 which, in response to the received control signals, drives the first and second X-axis linear motors 50, 60 and the first and second Y-axis linear motors 70, 80.

When the controller 110 receives from an outside a signal for adjusting the origin (hereinafter, referred to as "SAO"), the controller 110 sends the control signals to the driver 120 so as to drive the motors 50, 60, 70, 80 to move the first and second vision units 10, 20 to the first and second reference points A, B, respectively. Upon receipt of the control signals from the controller 110, the driver 120 generates a plurality of driving signals to be applied to the motors 50, 60, 70, 80 for driving them.

With the driving of the motors 50, 60, 70, 80, the first and second vision units 10, 20 are, respectively, moved to the first and second reference points A, B. That is, the controller 110 is operated to move the first vision unit 10 to the first reference point A and to move the second vision unit 20 to the second reference point B. When the movements of the vision units 10, 20 to respective destination positions are completed, then the first and second vision units 10, 20 generate the coordinates of the sensed first and second reference points A, B and send the generated coordinates to the controller 110.

The controller 110 receiving the generated coordinates of the first and second reference points A, B controls the movable element driver 120 to move again the first and second vision units 10, 20 to the MIOs O. The first and second vision units 10, 20 having been moved to the respective positions of the MIOs O generate respective coordinates of the MIOs O and send the coordinates to the controller 110. Thus, the controller 110 has both the coordinates of the first and second reference points A, B and the MIOs O. Then, the controller 110 uses the coordinate values to compute the distances that the first and second module heads 30, 40 have traveled.

If the distances are obtained, the controller 110 computes offset values due to the differences of the distances traveled by the first and second module heads 30, 40. In order to make the obtained offset values "zero", the controller 110 drives the motors 50, 60, 70, 80 to adjust the origins of the first and second module heads 30, 40. When adjusting the origins of the first and second module heads 30, 40, the controller 110 moves both the first and second vision units 10, 20 to the first and second reference points A, B and the MIO O to adjust the origins of the first and second module heads 30, 40.

A method for adjusting the origins of the first and second module heads 30, 40 by the controller 110 will be described with reference to the accompanying drawings.

Figure 3:
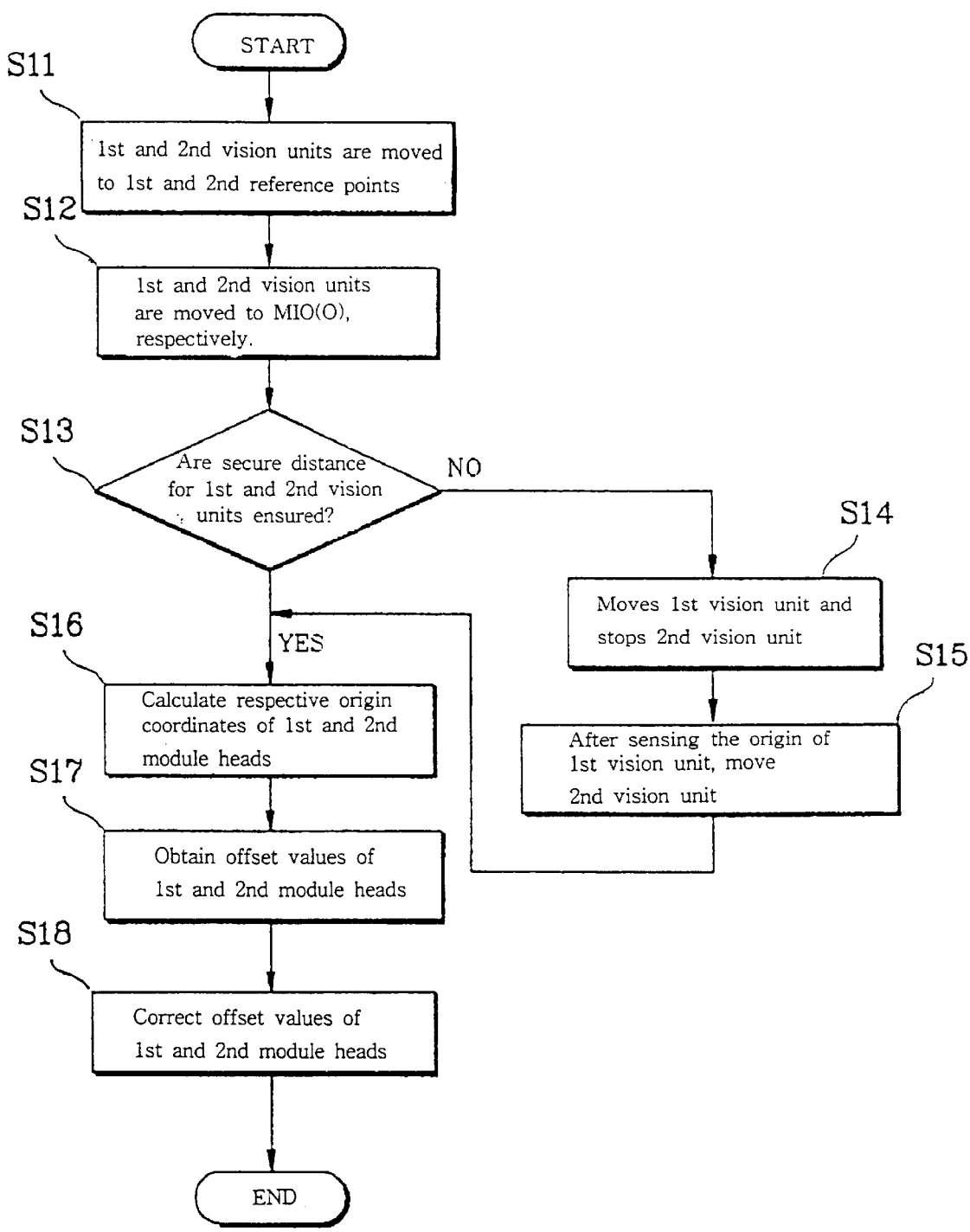
FIG. 3 is a flow-chart showing the procedural steps for adjusting the origins of the first and second module heads of the surface mounting apparatus according to the present invention.

FIG. 3 is a flow-chart showing the procedures for adjusting the origins of the first and second module heads of the surface mounting apparatus according to the present invention. As shown in FIG. 3, firstly, the first and second vision units 10, 20 are, respectively, moved to the first and second reference points A, B (step S11). The movements of the units 10, 20 are made by the motors 50, 60, 70, 80 under the control of the controller 110.

After the movements of the units 10, 20 to the points A, B have been completed, the first and second vision units 10, 20 are moved from the first and second reference points A, B to the MIOs O and sense the MIOs O (step S12). While the first and second vision units 10, 20 sense the MIOs O, it is checked whether or not a secure distance between the first and second vision units 10, 20 is ensured (step S13). This is confirmed by the controller which moves both the first and second vision units 10, 20, such that the first and second vision units 10, 20 do not collide during their movements from the first and second reference points A, B to the MIOs O.

As a confirmed result, if the secure distance between the first and second vision units 10, 20 is not ensured, the priority may be given to the first vision unit 10, and at this time, in order to sense the MIO O therefor, the second vision unit 20 stops (step S14). While the second vision unit 20 stops moving, the MIO associated with the first vision unit 10 is sensed, and thereafter, the second vision unit 20 is moved to the associated MIO O (step S15).

With the secure distance between the first and second vision units 10, 20 being ensured, where the sensing of the MIOs is completed, the controller 110 computes coordinates of the origins of the respective first and second module heads 30, 40 based on the distance traveled from the MIOs as a base point to the first and second reference points A, B (step S16). After each of the coordinates of the origins of the first and second module heads 30, 40 is computed, the controller 110 computes offset values due to the differences of the distances traveled by the first and second module heads 30, 40 (step S17). The obtained offset values are corrected to thereby set the origins of the first and second module heads 30, 40 (step S18).

Figure 4:
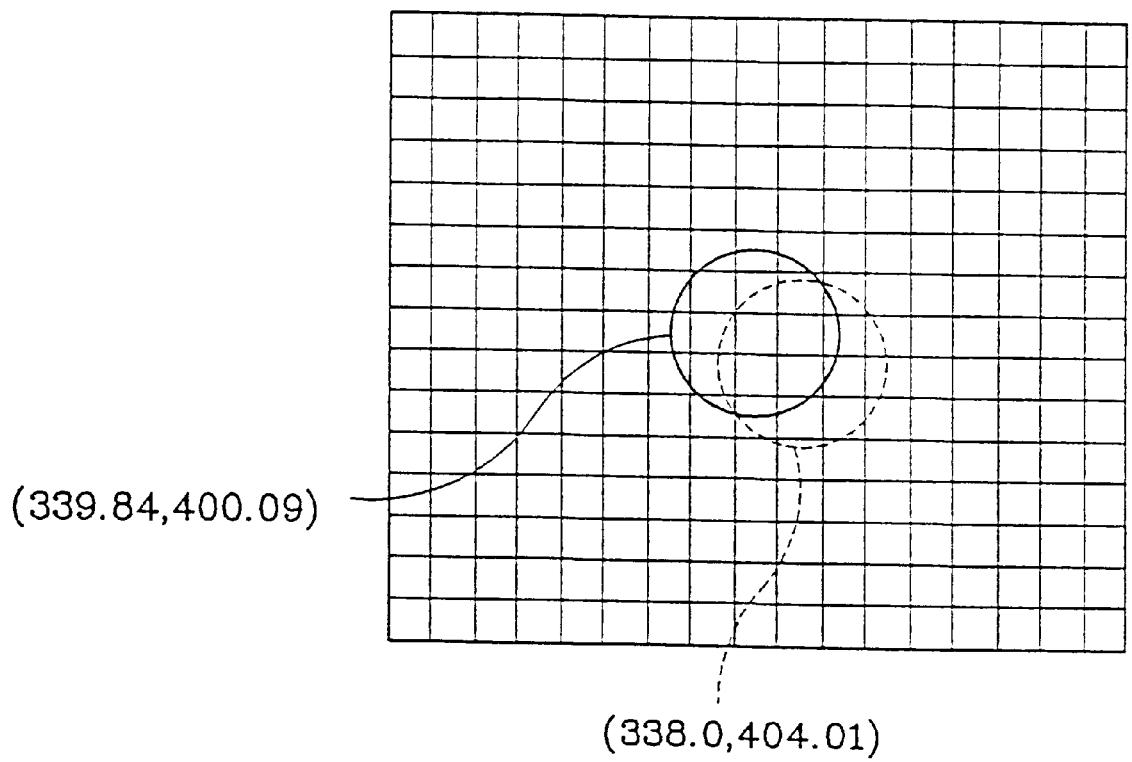
FIG. 4 is a schematic view showing an illustrative offset amount between the first and second heads in FIG. 3.

At the time of setting the origins of the first and second module heads 30, 40, the offset values relating to the first and second module heads 30, 40 are corrected so that the offset values become zero-value. Thus, the origins are set. Referring to FIG. 4, the method for setting the origins is explained below. As shown in FIG. 4, in the illustrative case where the computed origin coordinates of the first and second module heads 30, 40 are the coordinates (339.84, 400.09) and (338.0, 404.01), respectively, the adjustment of the origins is made by correcting the offset values found from the respective coordinates to become "zero-value", so that the relative positions of the first and second module heads 30, 40 are identical to each other.

The origin adjustment of the first and second module heads installed in the dual gantry can simply and promptly be made. The first and second reference points and the MIO can be used for adjusting the origins, without using a separate apparatus for that purpose, and thus the repeatable precision of the adjustment of the origins can be improved. Also, the apparatus for adjusting the origins of the first and second module heads are easily incorporated into the surface mounting apparatus for the dual gantry.

What is claimed is:

1. An apparatus for repeatable and on-demand automatic adjustment of the origins of module heads of a surface mounting apparatus, the adjusting apparatus comprising:

an X-Y gantry having first and second X-axis linear motors and first and second Y-axis linear motors, the X-Y gantry defining an X-Y plane on which distal first and second reference points are preset with a single mark indicating the origin (MIO) disposed intermediately therebetween;

first and second module heads respectively coupled to the first and second X-axis linear motors;

first and second vision units respectively disposed adjacent the first and second module heads for sensing the first and second reference points and the MIO and generating and outputting coordinates of the sensed first and second reference points and the MIO; and, a controller for setting the origins of the first and second module heads one relative to the other, the controller being operable to actuate a repeatable origin adjusting sequence, wherein the controller drives the first and second X-axis linear motors and the first and second Y-axis linear motors to respectively move the first and second vision units in coordinated manner between the first and second reference points and the MIO, the controller receiving the coordinates output from the first and second vision units to compute at least one set of mutually referenced offset values relating to the first and second module heads, and computing the origins of the first and second module heads by responsively correcting the offset values for at least one of the first and second module heads.

2. The apparatus according to claim 1, wherein the first and second vision units generate respective coordinates when the first and second reference points and the MIO are centrally aligned.

3. The apparatus according to claim 1, wherein the first and second reference points and the MIO are set in size to be recognized by the first and second vision units at one time.

4. The apparatus according to claim 1, wherein the controller drives the first and second X-axis linear motors and the first and second Y-axis linear motors to move the first and second vision units to the first and second reference points and the MIO simultaneously, computes offset values relating to the first and second module heads to correct the origins.

5. The apparatus according to claim 1, wherein the first and second X-axis linear motors and the first and second X-axis linear motors comprise:

respective frames for moving the first and second module heads in X-Y axes directions; and a motor for generating a rotational force for driving the frames.

6. A method for repeatable and on-demand automatic adjustment of the origins of module heads of a surface mounting apparatus for a dual gantry, the method comprising the steps of:

moving first and second vision units to distal first and second reference points, respectively;

after completing the movement, moving the first and second vision units in coordinated manner to a single mark indicating the origin (MIO) disposed intermediately between the first and second reference points, each of the first and second vision units sensing to generate respective positional information for the MIO;

while the first and second vision units sense the MIO, automatically checking whether or not a secure collision-avoiding distance between the first and second vision units is ensured;

responsive to the secure distance between the first and second vision units being ensured and the sensing of the MIO being completed, computing coordinates of the origins of the respective first and second module heads based on the distance traveled respectively between the MIO as a base point and the first and second reference points;

computing the origins of the first and second module heads one relative to the other by computing at least one set of mutually referenced offset values, the offset values corresponding to the differences of the distances traveled by the first and second module heads; and setting the origins of the first and second module heads by responsively correcting the offset values for at least one of the first and second module heads.

7. The method according to claim 6, wherein the step of checking whether or not a secure distance between the first and second vision units is ensured comprises the steps of:

if the secure distance between the first and second vision units is not ensured, giving the priority to the first vision unit and stopping the second vision unit, in order to sense the MIO; and while the second vision unit stops, sensing the MIO associated with the first vision unit, and thereafter, moving the second vision unit to the associated MIO.

8. The method according to claim 6, wherein at the step of setting the origins of the first and second module heads by correcting the obtained offset values, the setting of the origin is made by correcting the offset value to become "zero-value".

* * * * *